(12) United States Patent
Lee et al.

(10) Patent No.: US 11,372,044 B2
(45) Date of Patent: Jun. 28, 2022

(54) SYSTEM AND METHOD FOR DETECTING FAULT OF QUICK CHARGE RELAY

(71) Applicants: HYUNDAI MOTOR COMPANY, Seoul (KR); KIA MOTORS CORPORATION, Seoul (KR)

(72) Inventors: Sang Kyu Lee, Yongin-si (KR); Young Chan Byun, Hwaseong-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 81 days.

(21) Appl. No.: 17/093,996

(22) Filed: Nov. 10, 2020

(65) Prior Publication Data

US 2021/0405116 A1 Dec. 30, 2021

(30) Foreign Application Priority Data

Jun. 30, 2020 (KR) .................. 10-2020-0080430

(51) Int. Cl.
*G01R 31/327* (2006.01)
*H02J 7/00* (2006.01)
*B60L 3/00* (2019.01)

(52) U.S. Cl.
CPC ........ *G01R 31/3278* (2013.01); *B60L 3/0046* (2013.01); *H02J 7/0047* (2013.01); *B60L 2240/547* (2013.01); *B60Y 2200/91* (2013.01)

(58) Field of Classification Search
CPC .. B60L 3/0046; B60L 53/11; B60L 2240/547; B60L 3/00; H02J 7/0047; H02J 7/0029; H02J 7/00; G01R 31/3278; G01R 31/327; B60Y 2200/91
See application file for complete search history.

(56) References Cited

U.S. PATENT DOCUMENTS

2018/0294660 A1* 10/2018 Byun .................... B60L 3/0046
2020/0184746 A1* 6/2020 Shin ........................ G07C 3/00
2020/0313581 A1* 10/2020 Chon ...................... H02M 1/36

FOREIGN PATENT DOCUMENTS

KR 10-2019-0058015 A 5/2019

* cited by examiner

*Primary Examiner* — Jermele M Hollington
*Assistant Examiner* — Suresh K Rajaputra
(74) *Attorney, Agent, or Firm* — Morgan, Lewis & Bockius LLP

(57) ABSTRACT

A charging system includes a charger, a battery charged by receiving a power of a first voltage from the charger, a multi-charge configured to boost a power of a second voltage lower than the first voltage to the first voltage and supply the boosted power to the battery, a charge relay connected at a position between the battery and the charger and configured to be switched to be in an ON state when the power of the first voltage is supplied from the charger and to be in an OFF state when the power of the second voltage is supplied from the charger, and a charging controller configured to control, based on whether a melting fault of the charge relay occurs, whether to supply the power of the first voltage to the battery through the charge relay or to supply the battery with the power through the multi-charge device.

9 Claims, 4 Drawing Sheets

SYSTEM AND METHOD FOR DETECTING FAULT OF QUICK CHARGE RELAY

CROSS-REFERENCE TO RELATED APPLICATION

This application claims the benefit of priority to Korean Patent Application No. 10-2020-0080430, filed in the Korean Intellectual Property Office on Jun. 30, 2020, the entire contents of which are incorporated herein by reference.

TECHNICAL FIELD

The present disclosure relates to a system and a method for detecting a fault of a quick charge relay, and more specifically, to a system and a method for detecting a fault of a quick charge relay capable of comparing a neutral terminal capacitor voltage, an inverter capacitor voltage, and a battery voltage with each other to diagnose whether the quick charge relay is melted, and controlling a multi-charge sequence operation based on whether the quick charge relay is melted.

BACKGROUND

In general, an eco-friendly vehicle such as an electric vehicle or a hybrid vehicle is equipped with a high voltage battery for supplying driving power to an electric motor. A relay (a main relay) for regulating a current applied to the high voltage battery is disposed together to protect the high voltage battery.

In addition, a quick charge relay for regulating a current between a charger and the high voltage battery during quick charge may be additionally disposed.

In a structure of connecting the main relay and the quick charge relay in series, the quick charger and the high voltage battery are connected to each other to initiate charging when both the main relay and the quick charge relay are turned on, so that a high voltage is not exposed to a quick charge port when the main relay is fused.

In addition, a multi-charge system is capable of charging a vehicle to which an 800 V battery is applied using a 400 V class charger. When charging the vehicle with an 800 V class charger or the 400 V class charger, the main relay and a multi-charge relay operate to perform the charging.

However, in a case of a conventional high voltage/power relay, a fault occurrence rate is higher than that of other electrical parts, and fusion or melting occurs based on a vibration, a humidity, an environment, or ON-OFF conditions.

In one example, the quick charge relay is able to be charged even when a fusion fault occurs, but is not able to be charged when a melting fault occurs. Because there is no diagnostic logic for the melting fault currently, a user is not able to know why the charging is not performed when the melting fault occurs.

SUMMARY

The present disclosure has been made to solve the above-mentioned problems occurring in the prior art while advantages achieved by the prior art are maintained intact.

An aspect of the present disclosure provides means capable of detecting an occurrence of a melting fault (or a relay operation circuit fault or a relay non-operation) of a quick charge relay and means capable of charging a battery even when the melting fault has occurred when charging the battery using a 800 V class charger in a vehicle to which a multi-charge system is applied, and provides a system and a method for detecting a fault of a quick charge relay capable of diagnosing whether the quick charge relay is melted by comparing a neutral terminal capacitor voltage, an inverter capacitor voltage, and a battery voltage with each other, and controlling a multi-charge sequence operation based on whether the quick charge relay is melted to allow the battery to be charged.

The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, a system for detecting a fault of a charge relay includes a battery charged by receiving a power of a first voltage from a charger, a multi-charge device including an inverter and a driving motor, wherein when a power of a second voltage lower than the first voltage is supplied through the charger, the multi-charge device boosts the power of the second voltage to the first voltage using the inverter and the driving motor and supplies the boosted power to the battery, the charge relay connected at a position between the battery and the charger, wherein the charge relay is switched to be in an ON state when the power of the first voltage is supplied from the charger and is switched to be in an OFF state when the power of the second voltage is supplied from the charger, and a charging controller that diagnoses a melting fault of the charge relay, controls the power of the first voltage supplied from the charger to be supplied to the battery through the charge relay when determining that the charge relay is operating normally, and controls the power to be supplied to the battery through the multi-charge device when determining that the melting fault has occurred at the charge relay.

In one implementation, one end of the charge relay may be connected to a positive terminal of the battery and the other end of the charge relay may be connected to a positive terminal of the charger.

In one implementation, the multi-charge device may include a booster circuit including the inverter and the driving motor, an inverter capacitor connected to an output terminal of the booster circuit, a multi-charge relay connected at a position between the other end of the charge relay and an input terminal of the booster circuit, and a neutral terminal capacitor connected at a position between the other end of the charge relay and a negative terminal of the battery.

In one implementation, the charging controller may determine that the charge relay is operating normally when voltages of the inverter capacitor, the battery, and the neutral terminal capacitor are the same.

In one implementation, the charging controller may control the multi-charge relay to be turned off when determining that the charge relay is operating normally.

In one implementation, the charging controller may determine that the melting fault has occurred at the charge relay when a voltage of the neutral terminal capacitor is not the same as a voltage of the inverter capacitor or the battery.

In one implementation, the charging controller may control the multi-charge relay to be turned on when determining that the melting fault has occurred at the charge relay.

According to another aspect of the present disclosure, a method for detecting a fault of a charge relay includes a diagnosis operation of diagnosing, by a charging controller, a melting fault of the charge relay connected at a position between a battery charged by receiving, from a charger, a power of a first voltage and the charger, a first supply operation of controlling, by the charging controller, the power of the first voltage supplied from the charger to be supplied to the battery through the charge relay when determining that the charge relay is operating normally, and a second supply operation of boosting, by the charging controller, a power of a second voltage lower than the first voltage supplied from the charger to the first voltage and then supplying the boosted power to the battery through a multi-charge device when determining that the melting fault has occurred at the charge relay.

In one implementation, the diagnosis operation may include determining, by the charging controller, that the charge relay is operating normally when voltages of an inverter capacitor connected to an output terminal of a booster circuit including an inverter and a driving motor, the battery, and a neutral terminal capacitor connected at a position between the other end of the charge relay and a negative terminal of the battery are the same.

In one implementation, the first supply operation may include controlling a multi-charge relay to be turned off when controlling the power of the first voltage supplied from the charger to be supplied to the battery through the charge relay to charge the battery.

In one implementation, the diagnosis operation may include determining, by the charging controller, that the melting fault has occurred at the charge relay when the voltage of the neutral terminal capacitor is not the same as the voltage of the inverter capacitor or the battery.

In one implementation, the second supply operation may include controlling a multi-charge relay to be turned on when the second voltage is supplied from the charger.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
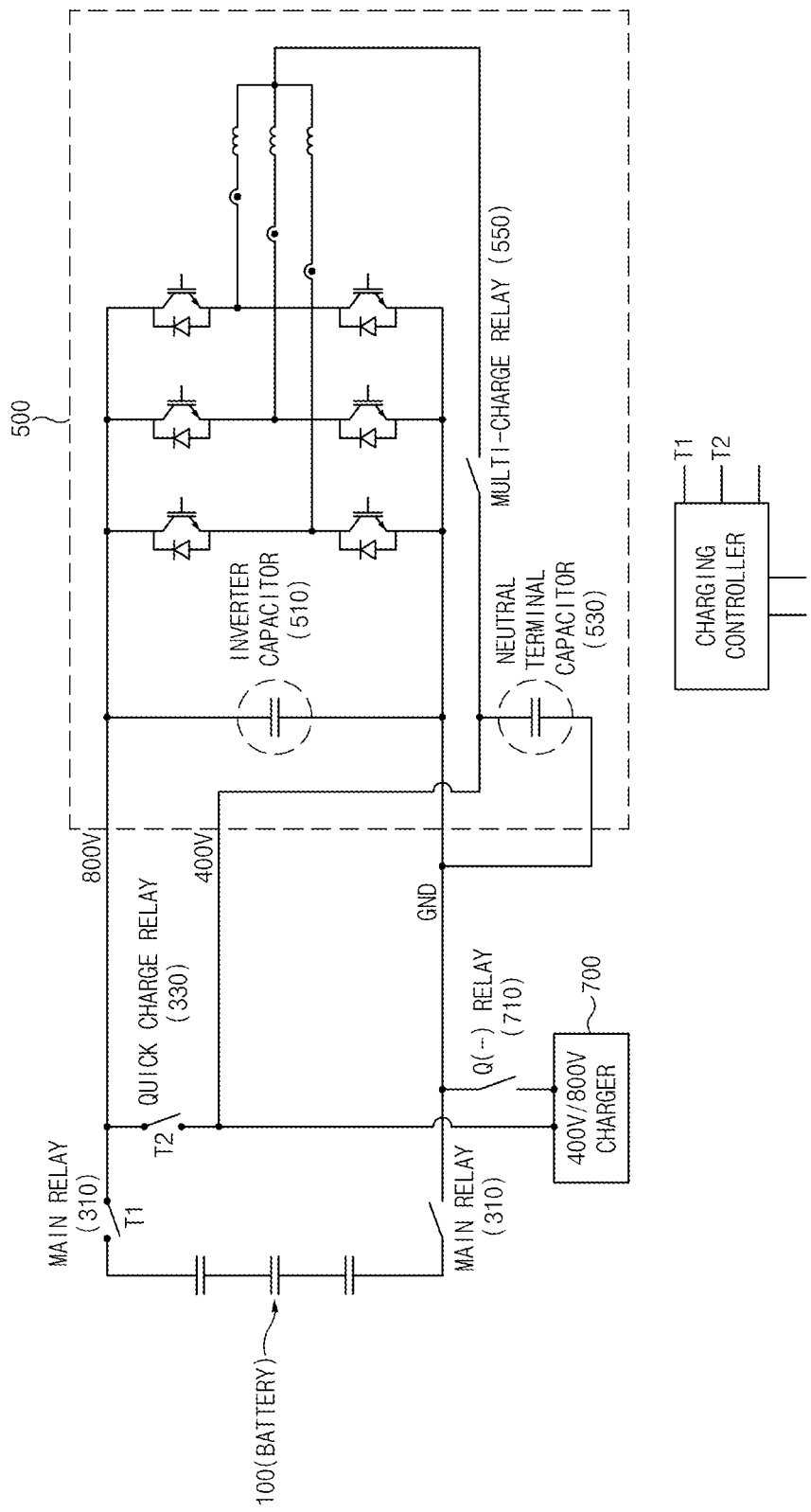
FIG. 1 is a diagram showing a system for detecting a fault of a quick charge relay according to an embodiment of the present disclosure.

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of the related known configuration or function will be omitted when it is determined that it interferes with the understanding of the embodiment of the present disclosure.

In describing the components of the embodiment according to the present disclosure, terms such as first, second, A, B, (a), (b), and the like may be used. These terms are merely intended to distinguish the components from other components, and the terms do not limit the nature, order or sequence of the components. Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in detail with reference to FIGS. 1 to 3.

FIG. 1 is a diagram showing a system for detecting a fault of a quick charge relay according to an embodiment of the present disclosure. FIG. 2 is a diagram for illustrating a process of charging with 800 V in a system for detecting a fault of a quick charge relay according to an embodiment of the present disclosure. Further, FIG. 3 is a diagram for illustrating a process of charging using a multi-charge device in a system for detecting a fault of a quick charge relay according to an embodiment of the present disclosure.

First, a charge system including a quick charge relay according to the present disclosure, which is a technology about multi-input charging, may directly charge a battery when an 800 V class charger is connected, and boost a voltage to 800 V and then charge the battery through a multi-charge device including a driving motor and an inverter of an electric vehicle when a 400 V class charger is connected. The voltage of 800 V and the voltage of 400 V are described as an example, and the present disclosure should not be limited thereto.

In this connection, the quick charge relay connected at a position between the charger and the battery may change a charging path by being turned ON or OFF based on the voltage of the charger to be used.

That is, when the 800 V class charger is connected, the quick charge relay may be switched to be in the ON state to allow the voltage of the charger to be directly supplied to the battery. When the 400 V class charger is connected, the quick charge relay may be switched to be in the OFF state to allow the voltage of the charger not to be directly supplied to the battery, but to be boosted to 800 V and supplied through the multi-charge device.

Referring to FIG. 1, a system for detecting a fault of a quick charge relay according to an embodiment of the present disclosure, which is capable of detecting a melting fault (including a relay operation circuit fault or a relay non-operation) in which a circuit of a quick charge relay 330 is disconnected by heat, may include a battery 100, a main relay 310, the quick charge relay 330, a Q(−) relay 710, a multi-charge device 500, and a charging controller.

In FIG. 1, a charger 700 may be disposed outside the vehicle, and may supply electric energy of 400 V or 800 V to the vehicle when being electrically connected to the vehicle.

The battery 100 may be a high voltage battery that supplies a driving voltage to a driver, such as a motor, of the vehicle. When the vehicle and the charger 700 are electrically connected to each other, the battery 100 may be charged with the voltage of 800 V using the voltage supplied from the charger 700.

The main relay 310, which is connected in series to each of a positive (+) terminal and a negative (−) terminal of the battery 100, may regulate a current input to or output from the battery 100.

An initial charge resistance and an initial charge relay may be connected in parallel to the main relay 310 connected to the positive (+) terminal of the battery 100. When an electrical circuit is formed by the main relay 310, the initial charge resistance and the initial charge relay may serve to prevent the main relay 310 from being fused.

One end of the quick charge relay 330 is connected to the main relay 310 connected to the positive (+) terminal of the battery 100, and the other end of the quick charge relay 330 is connected to a positive (+) terminal of the charger 700. When the charger 700 is electrically connected to the vehicle, the quick charge relay 330 may regulate a current between the battery 100 and the charger 700.

The main relay 310 and the quick charge relay 330 may be turned on when the battery 100 is charged, and may allow a charging power applied from the charger 700 to be supplied to the battery 100.

In this connection, the main relay 310 and the quick charge relay 330 may be controlled to be sequentially turned on, may be controlled such that the quick charge relay 330 is turned on after the main relay 310 is turned on based on a quick charge scheme, or may be controlled such that the main relay 310 is turned on after the quick charge relay 330 is turned on.

For example, in a case of a combo charging scheme, the quick charge relay 330 may be controlled to be turned on after the main relay 310 is turned on. In a case of a CHAdeMO charging scheme or an SGS charging scheme, the main relay 310 may be controlled to be turned on after the quick charge relay 330 is turned on.

A DC voltage of 800 V supplied from the charger 700 may charge the battery 100 without being boosted because the charging voltage of the battery 100 is 800 V.

The Q(−) relay 710 may be connected at a position between a negative (−) terminal of the charger 700 and the negative (−) terminal of the battery 100.

When a DC voltage of 400 V is supplied through the charger 700, the multi-charge device 500 boosts the voltage of 400 V to the voltage of 800 V through a three-phase driving motor and the inverter, and then supplies the voltage of 800 V to the battery 100 to allow the battery 100 to be charged. The multi-charge device 500 may include a booster circuit including the driving motor and the inverter, an inverter capacitor 510, a neutral terminal capacitor 530, and a multi-charge relay 550.

The booster circuit, which may include a 3-leg half bridge circuit, may form a leg including an inductor at a position between a pair of switching elements to form a booster circuit of a boost scheme, thereby boosting an input voltage of 400 V to generate an output voltage of 800 V.

In this connection, the inductor may be a coil of the driving motor, and the switching element may be a component of the inverter.

Therefore, the combination of the inductor of the driving motor and the switching element of the inverter may form the booster circuit of the boost scheme to boost the input voltage of 400 V, thereby generating the output voltage of 800 V.

The multi-charge relay 550 may connect the other end of the quick charge relay 330 and an input terminal of the booster circuit in series, and may regulate a current between the booster circuit and the charger 700 when the charger 700 is electrically connected to the vehicle.

The neutral terminal capacitor 530 may be connected in parallel between the other end of the quick charge relay 330 and the negative (−) terminal of the battery 100, and may stably control the input terminal of the booster circuit by removing a ripple of the DC voltage when boosting the input voltage of 400 V to generate the output voltage of 800 V.

The inverter capacitor 510 may be connected in parallel to both ends of the half bridge circuit, which is an output terminal of the booster circuit, and may stably control the output terminal of the booster circuit by removing the ripple of the DC voltage that is boosted and output when charging the battery 100.

The inverter capacitor 510 and the neutral terminal capacitor 530 may be connected in parallel with each other.

In one example, during traveling of the vehicle, the inverter of the multi-charge device 500 may convert the DC power charged in the battery 100 to an AC power and supply the AC power to the driving motor for the vehicle, thereby allowing the vehicle to travel.

The charging controller may include a battery management system (BMS). When diagnosing a melting fault of the quick charge relay 330 and determining that the quick charge relay 330 is operating normally, the charging controller may control such that the voltage of 800 V supplied from the charger 700 is supplied to the battery 100 through the quick charge relay 330. Further, when determining that the melting fault has occurred at the quick charge relay 330, the charging controller may control such that a power is supplied to the battery 100 through the multi-charge device 500.

First, the charging controller may identify voltages of the inverter capacitor 510 and the neutral terminal capacitor 530 after controlling the quick charge relay 330 and the main relay 310 to be turned on for diagnosing whether the quick charge relay 330 is melted.

Then, because the inverter capacitor 510 and the neutral terminal capacitor 530 are connected with each other in parallel, when the quick charge relay 330 is connected in a circuit, voltages of the inverter capacitor 510, the battery 100, and the neutral terminal capacitor 530 may be the same.

Therefore, when the voltages of the inverter capacitor 510, the battery 100, and the neutral terminal capacitor 530 are the same, it may be determined that the quick charge relay 330 is operating normally.

Figure 2:
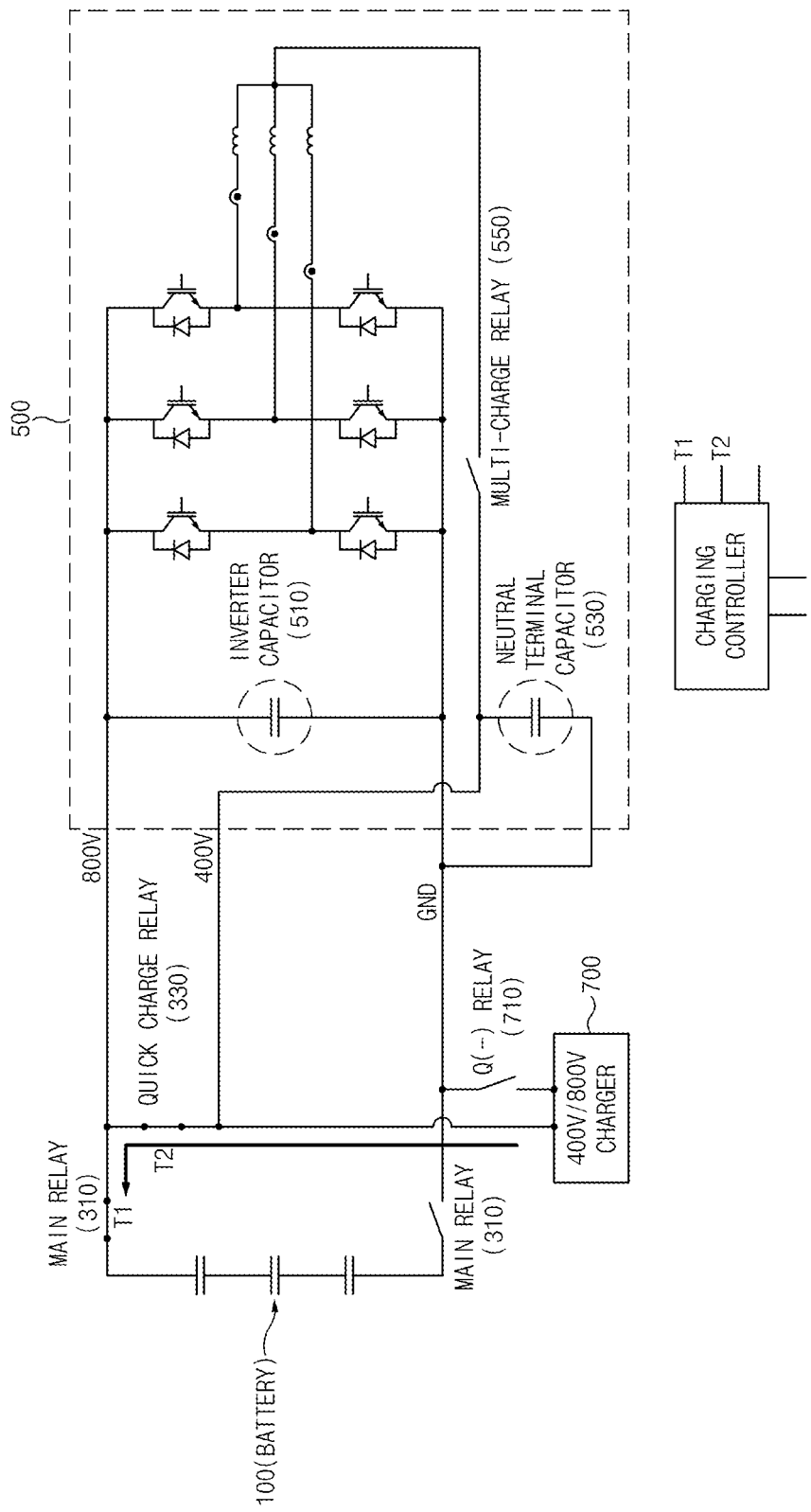
FIG. 2 is a diagram for illustrating a process of charging with 800 V in a system for detecting a fault of a quick charge relay according to an embodiment of the present disclosure.

Referring to FIG. 2, determining that the quick charge relay 330 is operating normally, the charging controller may control the quick charge relay 330 and the main relay 310 to be turned on and control the multi-charge relay 550 to be turned off as a basic charging operation, thereby allowing the power of the 800 V voltage supplied from the charger 700 to be quickly charged to the battery 100 through the quick charge relay 330.

In one example, when the voltages of the inverter capacitor 510 and the battery 100 are the same, but the voltage of the neutral terminal capacitor 530 is not the same as the voltage of the inverter capacitor 510 or the battery 100, the charging controller may determine that the melting fault has occurred at the quick charge relay 330. Although not shown, voltage sensors or voltage measurement circuits may be included to measure voltages of the respective elements and transmit the measured results to the charging controller, so that the charging controller may determine whether the melting fault has occurred at the quick charge relay 330 based on the measured results.

That is, when the quick charge relay 330 is disconnected in the circuit because of the melting fault, because the parallel connection between the inverter capacitor 510 and the neutral terminal capacitor 530 is disconnected, the voltage may vary.

Figure 3:
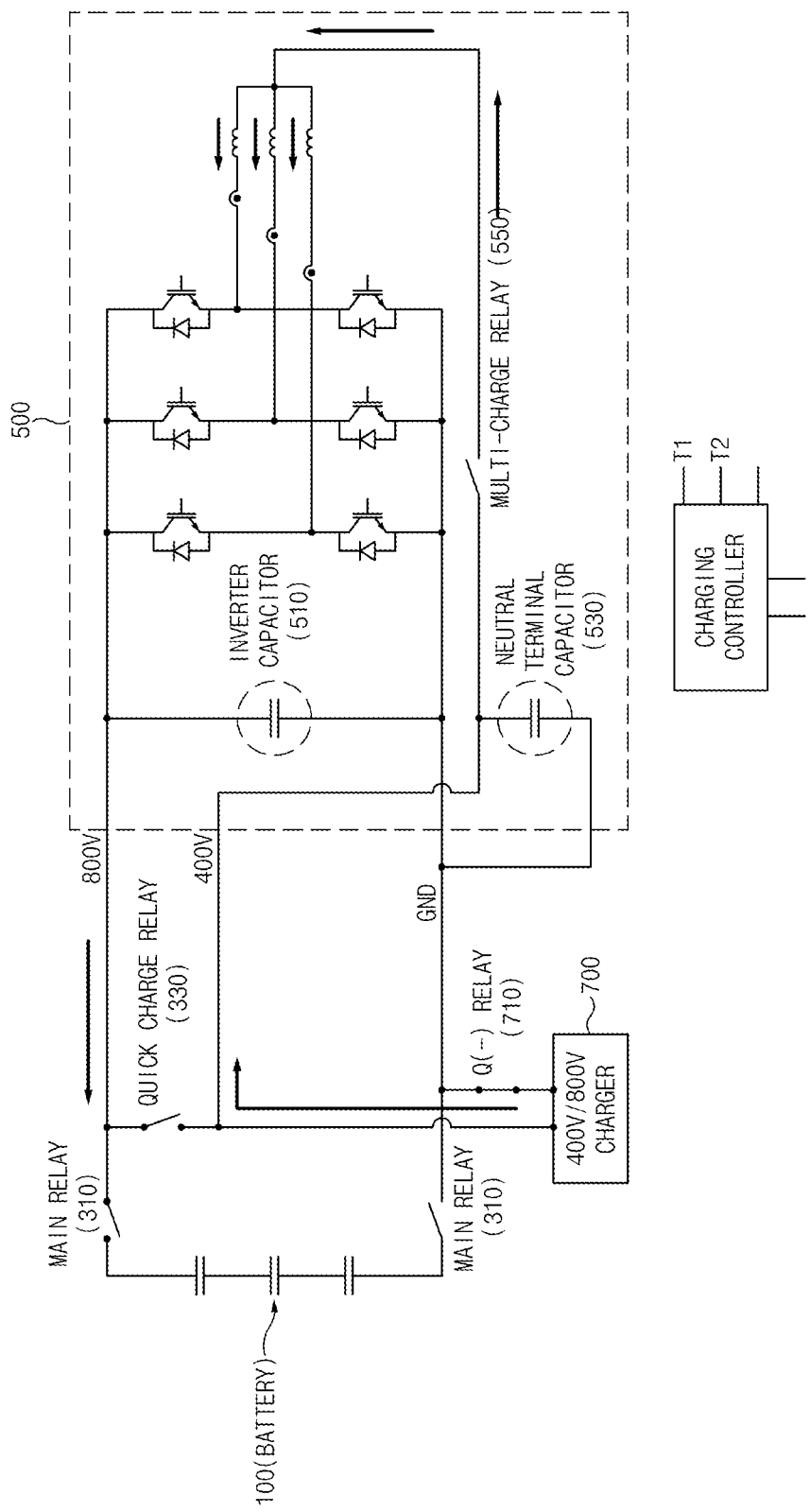
FIG. 3 is a diagram for illustrating a process of charging using a multi-charge device in a system for detecting a fault of a quick charge relay according to an embodiment of the present disclosure.

Referring to FIG. 3, when determining that the melting fault has occurred at the quick charge relay 330, the charging controller may, as a multi-charging operation, control the multi-charge relay to be turned on, and control the neutral terminal capacitor 530 to be initially charged and the Q(−) relay to be turned on.

Subsequently, the power of the 400 V voltage supplied from the charger 700 may be boosted to be the power of the 800 V voltage through the booster circuit, and then allow the battery 100 to be quickly charged.

Figure 4:
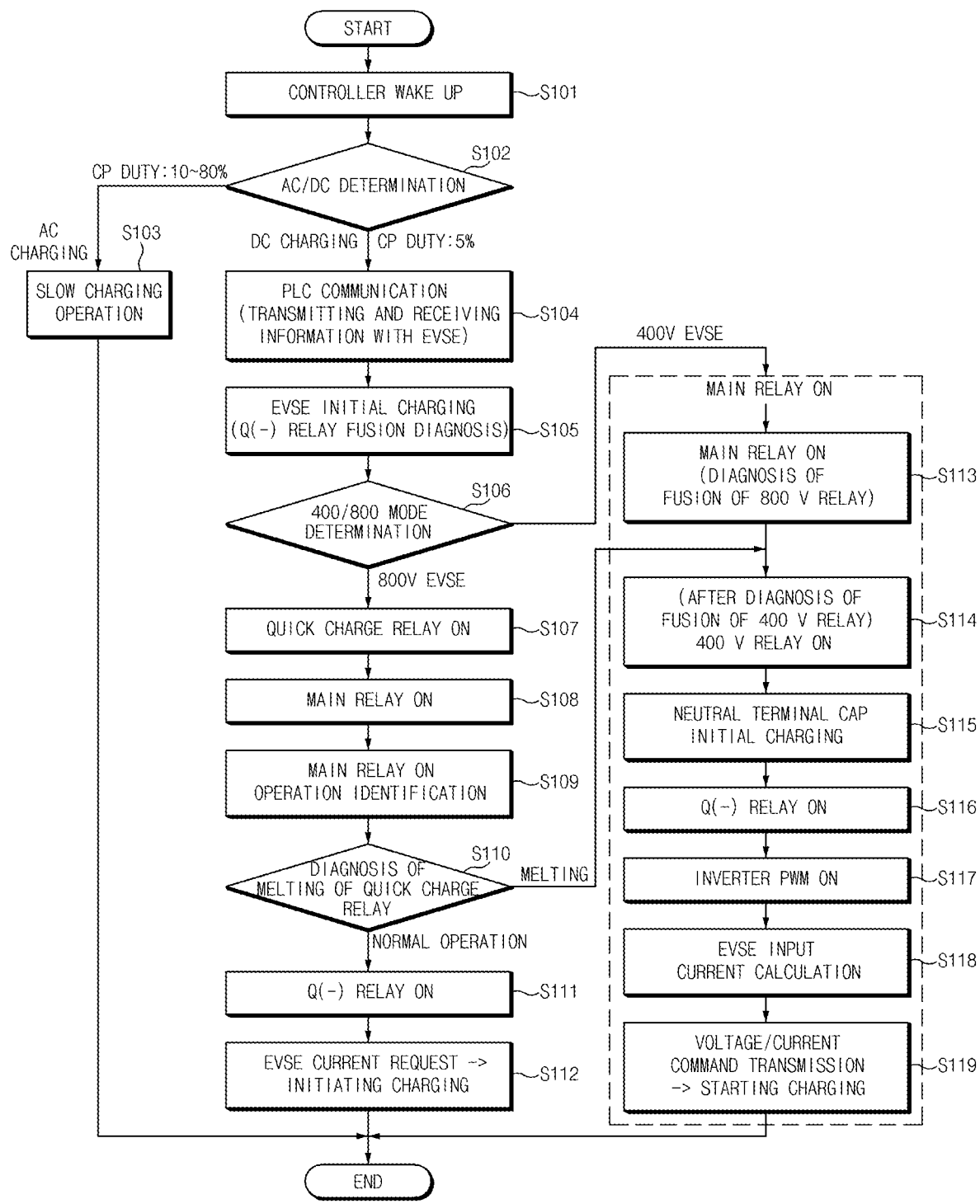
FIG. 4 is a flowchart for illustrating a method for detecting a fault of a quick charge relay according to an embodiment of the present disclosure.

Hereinafter, a method for detecting a fault of a quick charge relay according to another embodiment of the present disclosure will be described in detail with reference to FIG. 4. FIG. 4 is a flowchart for illustrating method for detecting a fault of a quick charge relay according to an embodiment of the present disclosure.

Hereinafter, it is assumed that the system for detecting the fault of the quick charge relay in FIG. 1 performs a process in FIG. 4.

First, when the vehicle is started and the charger is connected for the charging, the controller wakes up (S101). The charging controller may determine whether the charging is AC charging or DC charging. When determining that the charging is the AC charging (S102), the charging controller may charge the battery 100 through a charging process using a slow charger (S103).

The slow charger supplies a commercial AC power to the vehicle as it is in a form of AC. The AC voltage supplied from the slow charger may be used to charge the battery 100 after being rectified to the DC voltage of 800 V by a vehicle-mounted charger (an on board charger, OBC) inside the vehicle.

In one example, when determining that the charging is the DC charging (S102), the charging controller may communicate with the charger 700 (EVSE) through a PLC communication (S104), and perform diagnosis of a fusion of the Q(−) relay 710 as the initial charging process of the charger 700 (S105).

Subsequently, the charging controller may determine whether the power of the 400 V voltage or the power of the 800 V voltage is supplied from the charger 700 (S106).

Then, when the power of the 800 V voltage is supplied, as the basic charging operation, the charging controller may control the quick charge relay 330 to be turned on (S107), control the main relay 310 to be turned on (S108), and determine whether the main relay 310 is operating in the ON state (S109).

Subsequently, the charging controller may perform the diagnosis of the melting of the quick charge relay 330 (S110). When determining that the quick charge relay 330 is operating normally, the charging controller may control the Q(−) relay 710 to be turned on (S111). Further, the charging controller may request a current to the charger 700 to allow the power of the 800 V voltage to be charged to the battery 100 (S112).

In one example, when determining that the quick charge relay 330 is melted and faulty (S110), as the multi-charging operation, the charging controller may control the multi-charge relay 550 to be turned on to diagnose a fusion of the multi-charge relay 550 (S114), initially charge the neutral terminal capacitor 530 (S115), and control the Q(−) relay 710 to be turned on (S116).

Subsequently, the charging controller may control the booster circuit to be turned on (S117), calculate the input current of the charger 700 (S118), and request the current to the charger 700 to allow the battery 100 to be charged with the power of 800 V voltage obtained by boosting the power of the 400 V voltage (S119).

In one example, the charging controller may charge the battery 100 through the multi-charging operation by directly selecting the supply of the power of the 400 V voltage in the determining of whether the power of 400 V voltage or the power of the 800 V voltage is supplied from the charger 700 (S106).

That is, the charging controller may select the supply of the power of the 400 V voltage from the charger 700, control the main relay 310 to be turned on, and then perform diagnosis of a fusion of the quick charge relay 330 (S113), and subsequently, control the multi-charge relay 550 to be turned on after the fusion diagnosis (S114), thereby charging the battery 100 through the multi-charging operation.

As described above, the present technology suggests means capable of detecting the occurrence of the melting fault (or the relay operation circuit fault or the relay non-operation) of the quick charge relay and means capable of charging the battery even when the melting fault has occurred when charging the battery using the 800 V class charger in a vehicle to which a multi-charge system is applied. The present technology has effects of diagnosing whether the quick charge relay is melted by comparing the neutral terminal capacitor voltage, the inverter capacitor voltage, and the battery voltage with each other, controlling a multi-charge sequence operation based on whether the quick charge relay is melted to allow the battery to be charged, and increasing charging robustness in a situation in which faults of parts has occurred.

In one example, the method for detecting the fault of the quick charge relay based on S101 to S119 according to the present disclosure may be programmed and stored in a recording medium to be read by a computer.

Thus, the operations of the method and/or the operations performed by the charging controller may be embodied in hardware or a software module. The software module may reside on a computer-readable non-transitory storage medium such as a RAM, a flash memory, a ROM, an EPROM, an EEPROM, a register, a hard disk, a removable disk, and a CD-ROM. The storage medium may be coupled to the charging controller which includes a processor. When the processor executes the software module, the processor may be configured to perform the above described operations including, but not limited to, performing various determinations and transmitting on/off signals to respective relays/switches so as to control on/off of the respective relays/switches.

The description above is merely illustrative of the technical idea of the present disclosure, and various modifications and changes may be made by those skilled in the art without departing from the essential characteristics of the present disclosure.

Therefore, the embodiments disclosed in the present disclosure are not intended to limit the technical idea of the present disclosure but to illustrate the present disclosure, and the scope of the technical idea of the present disclosure is not limited by the embodiments. The scope of the present disclosure should be construed as being covered by the scope of the appended claims, and all technical ideas falling within the scope of the claims should be construed as being included in the scope of the present disclosure.

The present technology suggests the means capable of detecting the occurrence of the melting fault (or the relay operation circuit fault or the relay non-operation) of the quick charge relay and the means capable of charging the battery even when the melting fault has occurred when charging the battery using the 800 V class charger in the vehicle to which the multi-charge system is applied. The present technology has the effects of diagnosing whether the quick charge relay is melted by comparing the neutral terminal capacitor voltage, the inverter capacitor voltage, and the battery voltage with each other, and controlling the multi-charge sequence operation based on whether the quick charge relay is melted to allow the battery to be charged.

In addition, various effects that are directly or indirectly identified through the present document may be provided.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A system for detecting a fault of a quick charge relay, the system comprising:
    a charger;
    a battery charged by receiving a power of a first voltage from the charger;
    a multi-charge device including an inverter and a driving motor, wherein when a power of a second voltage lower than the first voltage is supplied through the charger, the multi-charge device boosts the power of the second voltage to the first voltage using the inverter and the driving motor and supplies the boosted power to the battery;
    the quick charge relay connected at a position between the battery and the charger, wherein the quick charge relay is switched to be in an ON state when the power of the first voltage is supplied from the charger and is switched to be in an OFF state when the power of the second voltage is supplied from the charger; and
    a charging controller configured to:
        diagnose a melting fault of the quick charge relay;
        control the power of the first voltage supplied from the charger to be supplied to the battery through the quick charge relay when determining that the quick charge relay is operating normally; and
        control the power to be supplied to the battery through the multi-charge device when determining that the melting fault has occurred at the quick charge relay,
    wherein the multi-charge device includes:
    a booster circuit including the inverter and the driving motor;
    an inverter capacitor connected to an output terminal of the booster circuit;
    a multi-charge relay connected at a position between the other end of the quick charge relay and an input terminal of the booster circuit; and
    a neutral terminal capacitor connected at a position between the other end of the quick charge relay and a negative terminal of the battery,
    wherein the charging controller is configured to determine that the melting fault has occurred at the quick charge relay when a voltage of the neutral terminal capacitor is not the same as a voltage of the inverter capacitor or the battery.

2. The system of claim 1, wherein one end of the quick charge relay is connected to a positive terminal of the battery and the other end of the quick charge relay is connected to a positive terminal of the charger.

3. The system of, claim 1 wherein the charging controller is configured to determine that the quick charge relay is operating normally when voltages of the inverter capacitor, the battery, and the neutral terminal capacitor are the same.

4. The system of claim 3, wherein the charging controller is configured to control the multi-charge relay to be turned off when determining that the quick charge relay is operating normally.

5. The system of, claim 1 wherein the charging controller is configured to control the multi-charge relay to be turned on when determining that the melting fault has occurred at the quick charge relay.

6. A method for detecting a fault of a quick charge relay, the method comprising:
    a diagnosis operation of diagnosing, by a charging controller, a melting fault of the quick charge relay connected at a position between a battery charged by receiving, from a charger, a power of a first voltage and the charger;
    a first supply operation of controlling, by the charging controller, the power of the first voltage supplied from the charger to be supplied to the battery through the quick charge relay when determining that the quick charge relay is operating normally; and a second supply operation of boosting, by the charging controller, a power of a second voltage lower than the first voltage supplied from the charger to the first voltage and then supplying the boosted power to the battery through a multi-charge device when determining that the melting fault has occurred at the quick charge relay,
    wherein the diagnosis operation includes:
    determining, by the charging controller, that the quick charge relay is operating normally when voltages of an inverter capacitor connected to an output terminal of a booster circuit including an inverter and a driving motor, the battery, and a neutral terminal capacitor connected at a position between the other end of the quick charge relay and a negative terminal of the battery are the same, and
    determining, by the charging controller, that the melting fault has occurred at the quick charge relay when the voltage of the neutral terminal capacitor is not the same as the voltage of the inverter capacitor or the battery.

7. The method of claim 6, wherein the first supply operation includes:
    controlling a multi-charge relay to be turned off when controlling the power of the first voltage supplied from the charger to be supplied to the battery through the quick charge relay to charge the battery.

8. The method of claim 6, wherein the second supply operation includes:
    controlling a multi-charge relay to be turned on when the second voltage is supplied from the charger.

9. A non-transitory computer-readable recording medium, wherein a program for executing the method of claim 6 is recorded in the non-transitory computer-readable recording medium.

* * * * *